United States Patent
Sandhu et al.

(10) Patent No.: US 6,433,434 B1
(45) Date of Patent: Aug. 13, 2002

(54) APPARATUS HAVING A TITANIUM ALLOY LAYER

(75) Inventors: Gurtej Singh Sandhu; Donald L. Westmoreland, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/389,562

(22) Filed: Sep. 3, 1999

Related U.S. Application Data

(62) Division of application No. 09/030,705, filed on Feb. 25, 1998.

(51) Int. Cl.[7] ............................................. H01L 23/48
(52) U.S. Cl. ........................................ 257/764; 257/768
(58) Field of Search ............................... 257/768, 770, 257/763, 764

(56) References Cited

U.S. PATENT DOCUMENTS

| | | | |
|---|---|---|---|
| 3,900,312 A | 8/1975 | Terry et al. ................ 75/68 B |
| 4,359,490 A | 11/1982 | Lehrer ........................ 427/95 |
| 4,957,777 A | 9/1990 | Ilderem et al. .............. 427/55 |
| 5,049,975 A * | 9/1991 | Ajika et al. .................. 357/71 |
| 5,202,579 A * | 4/1993 | Fuji et al. ................... 257/751 |
| 5,374,591 A | 12/1994 | Hasegawa et al. ......... 437/187 |
| 5,391,410 A | 2/1995 | Nii et al. .................... 427/578 |
| 5,399,379 A | 3/1995 | Sandhu .................... 427/255.2 |
| 5,416,045 A | 5/1995 | Kauffman et al. .......... 437/174 |
| 5,425,392 A | 6/1995 | Thakur et al. ............... 437/173 |
| 5,453,640 A | 9/1995 | Kinoshita ................... 257/520 |
| 5,459,353 A * | 10/1995 | Kanazawa .................. 257/751 |
| 5,496,762 A | 3/1996 | Sandhu et al. .............. 437/60 |
| 5,506,166 A | 4/1996 | Sandhu et al. .............. 436/60 |
| 5,508,066 A | 4/1996 | Akahori ..................... 427/571 |
| 5,565,708 A * | 10/1996 | Ohsaki et al. .............. 257/764 |
| 5,567,243 A | 10/1996 | Foster et al. ............... 118/730 |
| 5,571,572 A | 11/1996 | Sandhu ...................... 427/585 |
| 5,595,784 A | 1/1997 | Kaim et al. ............... 427/255.2 |
| 5,607,722 A | 3/1997 | Vaartstra et al. .......... 427/248.1 |
| 5,633,200 A | 5/1997 | Hu ............................. 438/653 |
| 5,641,545 A | 6/1997 | Sandhu ..................... 427/573 |
| 5,644,166 A | 7/1997 | Honeycutt et al. ......... 257/754 |
| 5,693,557 A | 12/1997 | Hirao et al. ................. 437/60 |
| 5,747,116 A | 5/1998 | Sharan et al. .............. 427/534 |
| 5,773,890 A * | 6/1998 | Uchiyama et al. ......... 257/763 |
| 5,828,131 A | 10/1998 | Cabral, Jr. et al. ........ 257/757 |
| 5,834,131 A | 11/1998 | Ameen et al. .............. 438/656 |
| 5,838,052 A | 11/1998 | McTeer ...................... 257/437 |
| 5,956,595 A | 9/1999 | Zenke ........................ 438/398 |
| 5,973,402 A * | 10/1999 | Shinriki et al. ............ 257/768 |
| 5,976,976 A | 11/1999 | Doan et al. ................ 438/683 |
| 6,120,844 A | 9/2000 | Chen et al. .............. 427/255.28 |

OTHER PUBLICATIONS

Bachmann, P., et al., "Plasma–Assisted Chemical Vapor Deposition Processes", *MRS Bulletin*, 52–59, (Dec., 1988).
Bouteville, A., et al., "TiSi2 Selective Growth in a rapid thermal low pressure chemical vapor deposition system", *Journal of the Electrochemical society*, Manchester, NH, US, pp. 2260–2263, (Aug. 1992).

(List continued on next page.)

*Primary Examiner*—Jerome Jackson, Jr.
*Assistant Examiner*—Lourdes Cruz
(74) *Attorney, Agent, or Firm*—Schwegman, Lundberg, Woessner & Kluth, P.A.

(57) ABSTRACT

Structures within semiconductor devices having a titanium alloy layer are provided. The titanium alloy layer is formed through chemical vapor deposition by combining a first precursor with a reducing agent to form a seed layer, and by combining a second precursor with the seed layer to form the titanium alloy layer. Structures are described having a titanium alloy layer on sidewalls and an exposed base layer of a contact hole. Structures are further described having a titanium alloy layer on sidewalls of a contact hole and a titanium silicide layer on an exposed base layer of the contact hole. The structures are useful as device contacts to active areas of a semiconductor device, and as interlevel vias within semiconductor integrated circuits.

22 Claims, 3 Drawing Sheets

OTHER PUBLICATIONS

Cowher, M., et al., "Low Temperature CVD Garnet Growth", *J. Crystal Growth*, 46, 399–4020. (1979).

Engqvist, J., et al., "Selective deposition of TiSi2 from H2–TiCl4 Gas mixtures and si: Aspects of Thermodynamics including Critical evaluation of thermochemical data in the Ti–Si System", *Journal of the Electrochemical Society*, Manchester, NH, US, pp. 3197–3205, (Nov. 1992).

Esquivel, A., et al., "Electrical and Physical Characteristics of Dry Oxygen, High Pressure Oxidation for SUB–0.5 um CMOS Isolation", *Abst. Int'l Electron Devices Meeting*, (1994).

Herman, I., "Laser–Assisted Deposition of Thin Films from Gas–Phase and Surface–Adsorbed Molecules", *Chem. Rev.*, 89 1323, 1346–1349, (1989).

Ilderem, V., et al., "Optimized Deposition Parameters for Low Pressure Chemical Vapor Deposited Titanium Silicide", *J. Electrochemical Soc. : Solid State Science and Technology*, 2590–2596, (Oct. 1988).

Lee, J. et al., "Plasma enhanced chemical vapor deposition of blanket TiSi2 on oxide patterned wafers", *Journal of the Electrochemical society*, Manchester, NH, US. pp. 1159–1165, (Apr. 1992).

Lie, L., et al., "High Pressure Oxidation of Silicon in Dry Oxygen", *J. Electrochemical Soc. : Solid State Science Technology*, 2828–2834, (Dec. 1982).

Moeller, T., et al., "Semiconducting Elements, Ch. 30", *In: Chemistry with Inorganic Qualitative Analysis,* 2nd Edition, Academic Press, 995–996, (1984).

Morosanu, C., *Thin Films by Chemical Vapor Deposition,* Elsevier, N.Y., 42–54 & 460–475, (1990).

Panson, A., et al., "Chemical Vapor Deposition of YBa(2)Cu(3)O(7) Using Metalorganic Chelate Precursors", *Appl. Phys. Lett.*, 53, 1756–1758, (Oct., 1988).

Rosler, R., et al., "Plasma–Enhanced CVD of Titanium Silicide", *J. Vacuum Science Tech* B 2, 733–737, (Oct./Dec. 1984).

Wolf, S., *Silicon Processing for the VLSI Era*, vol. 2: *Process Integration*, Lattice Press, Sunset Beach, California, pp. 202–203, (1990).

Yu, M., et al., "Surface Chemistry of the WF(6)–Based Chemical Vapor Deposition of Tungsten", *IBM J. Research Development,* 34, 875–883, (Nov. 1990).

* cited by examiner

APPARATUS HAVING A TITANIUM ALLOY LAYER

This application is a divisional of U.S. Ser. No. 09/030,705, filed Feb. 25, 1998.

FIELD OF THE INVENTION

The present invention relates to a method for manufacturing semiconductor devices, and more particularly, to a method for depositing conformal titanium layers on a substrate.

BACKGROUND OF THE INVENTION

Device density in integrated circuits (ICs) is constantly being increased. To enable the increase in density, device dimensions are being reduced. As the dimensions of device contacts get smaller, device contact resistance increases, and device performance is adversely affected. Methods for decreasing device contact resistance in ICs are needed to obtain enhanced device and IC performance.

Device contacts with reduced resistance may be created by forming certain metals on a silicon semiconductor base layer. These metals react with the underlying silicon, for example, to form silicides. Silicide device contacts are desirable because they reduce the native oxide on silicon. The native oxide is undesirable because it increases the contact resistance.

In one embodiment, titanium is used to form silicide device contacts for two reasons. First, titanium silicide has superior gettering qualities. Also, titanium silicide forms low resistance contacts on both polysilicon and single-crystal silicon.

Titanium siuicide device contacts are normally formed with the following process. First, a thin layer of titanium is formed on top of the silicon base layer, such as a substrate. The titanium adjoins active regions exposed by contact holes in an isolating layer, such as an oxide, above the silicon base layer. Then, the silicon base layer is annealed. As a result, the titanium reacts with the active regions of silicon to form titanium silicide.

However, because titanium cannot be readily deposited in a pure form, additional processing steps are required to form titanium silicide device contacts. Titanium precursors, such as titanium tetrachloride, are commonly available and can be used to form titanium. Titanium tetrachloride, though, can only be reduced at temperatures exceeding 1000 degrees Celsius with certain reducing agents. At these temperatures, the silicon base layer will be damaged. Therefore, there is a need for a method of forming titanium from titanium precursors at lower temperatures.

Furthermore, the resistance of device contacts can be adversely increased by conductive layers coupled between the device contacts and other components. The conductive layers may be formed by the same metal layer used to form the device contacts. As device dimensions shrink, the contact holes become relatively deeper and narrower. Also, the walls of the contact holes become steeper, and closer to vertical. As a result, most metal deposition techniques form conductive layers having relatively small step coverage, and hence relatively high resistance. Step coverage is the ratio of the thickness of the conductive layer, in the contact hole, for example, that are substantially perpendicular and parallel to the semiconductor base layer. Thus, the effective contact resistance is increased. Therefore, there is also a need for a method of forming conductive layers having increased step coverage to reduce effective device contact resistance.

Conformal layers of titanium having good step coverage have been previously formed at lower temperatures with chemical vapor deposition. Such techniques are disclosed in U.S. Pat. Nos. 5,173,327, 5,273,783 and 5,278,100, which are hereby incorporated by reference. However, alternative, effective and efficient techniques for forming titanium films are desired.

SUMMARY OF THE INVENTION

The present invention provides a method, and a corresponding resulting structure, for forming conformal titanium films supported on a substrate of an integrated circuit (IC) by forming a seed layer supported by the substrate, and then reducing a titanium precursor with the seed layer. In one embodiment, the seed layer comprises zinc. The seed layer is formed by combining a first precursor and a reducing agent by chemical vapor deposition (CVD). Then, titanium is formed by combining a second precursor with the seed layer by CVD.

In another embodiment, the present invention may further comprise the step of annealing the titanium to form titanium silicide. In another embodiment, the step of forming the seed layer further comprises the step of forming a seed layer that is zinc according to the following chemical process (I):

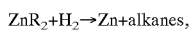

$$ZnR_2+H_2 \rightarrow Zn+alkanes,$$

wherein R is an alkyl group. In one embodiment, chemical process (I) is performed at a temperature between approximately 100 and 600 degrees Celsius.

In yet another embodiment, the first precursor may be dialkyl zinc. In yet another embodiment, the first precursor may be trimethyl zinc.

In yet another embodiment, the step of forming titanium further comprises the step of combining the zinc with the second precursor that is titanium tetrachloride according to the following chemical process (II):

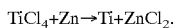

$$TiCl_4+Zn \rightarrow Ti+ZnCl_2.$$

In one embodiment, chemical process (II) is performed at a temperature between approximately 100 and 600 degrees Celsius.

In yet another embodiment, titanium may be formed in a single step according to the following chemical process (III):

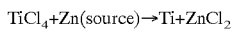

$$TiCl_4+Zn(source) \rightarrow Ti+ZnCl_2$$

In one embodiment, chemical process (III) is performed at a temperature between approximately 100 and 700 degrees Celsius.

In yet a further embodiment, the present invention may be an IC comprising a layer of a titanium alloy, coupled to a titanium silicide contact. In yet another embodiment, the present invention may be a memory comprising a memory array operatively coupled to a control circuit and an I/O circuit. The memory array, control circuit and I/O circuit comprise a layer of a titanium alloy coupled to titanium silicide contacts. In yet another embodiment, the titanium alloy may comprise titanium and zinc.

It is a benefit of the present invention that high step coverage metal layers can be formed. Further features and advantages of the present invention, as well as the structure and operations of various embodiments of the present invention, are described in detail below with reference to the accompanying drawings.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable persons skilled in the art to practice the invention, and it is to be understood that other embodiments may be utilized and that logical, mechanical and electrical changes may be made without departing from the spirit and scope of the present invention. The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined only by the appended claims.

Figure 1A:
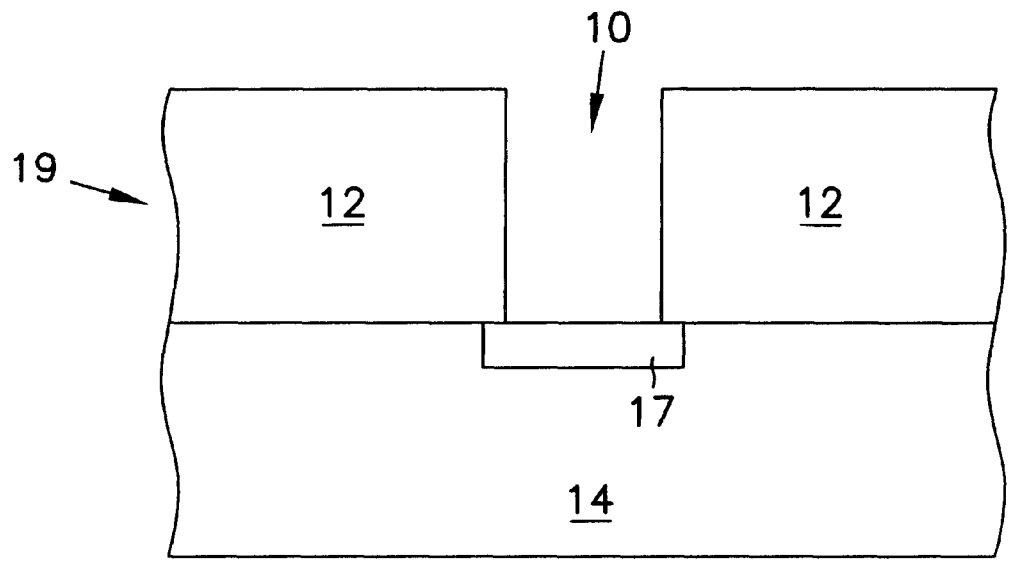
FIG. 1A is a cross-sectional view of a contact hole that has been etched through an insulative layer to an underlying semiconductor substrate.

In order to manufacture a device contact in an integrated circuit 19, a contact hole 10, as shown in FIG. 1A, is etched through an insulating layer 12, such as borophosphosilicate glass (BPSG) or silicon dioxide ($SiO_2$). As a result, an active region 17 of underlying semiconductor base layer or substrate 14, is exposed. A device contact is then formed on the exposed active region 17 in the following manner.

Figure 1B:
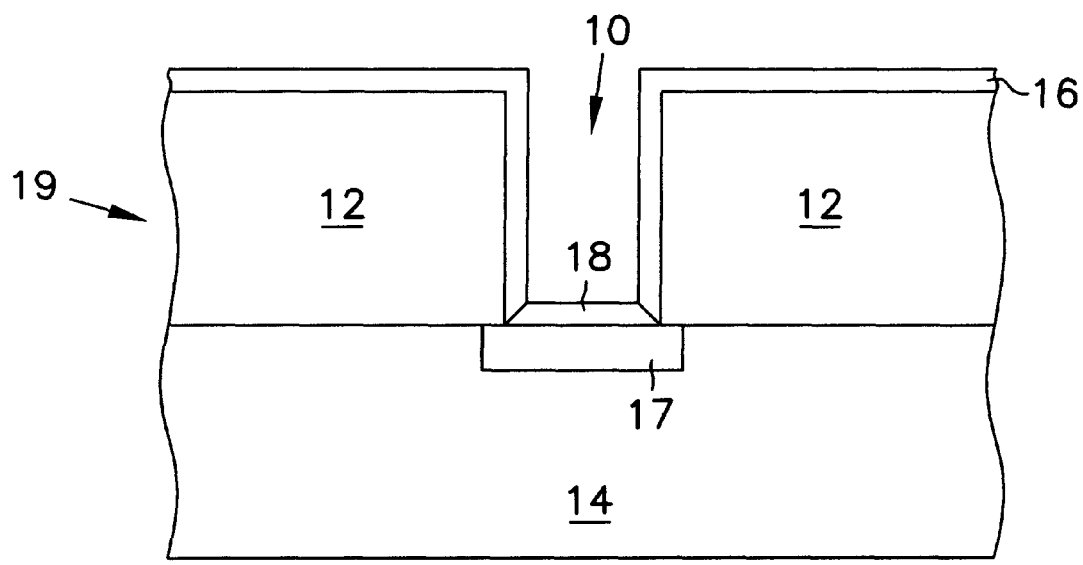
FIG. 1B is a cross-sectional view of the contact hole of FIG. 1A, comprising titanium and titanium silicide film.

Chemical vapor deposition (CVD) is used to form a conformal layer of titanium or titanium alloy on the integrated circuit 19 by a subsequently described method. CVD is further described in U.S. Pat. No. 5,278,100. In one embodiment, the conformal layer has a step coverage of at least one hundred percent in the contact hole 10, even for a high aspect ratio contact hole (i.e., a contact hole that is much deeper than it is wide). As a result, a low resistance layer of titanium or titanium alloy 16 is formed on the insulating layer 12, as shown in FIG. 1B. A portion of the layer 16 is formed as a low resistance device contact 18 of titanium silicide over the active region 17.

Figure 2:
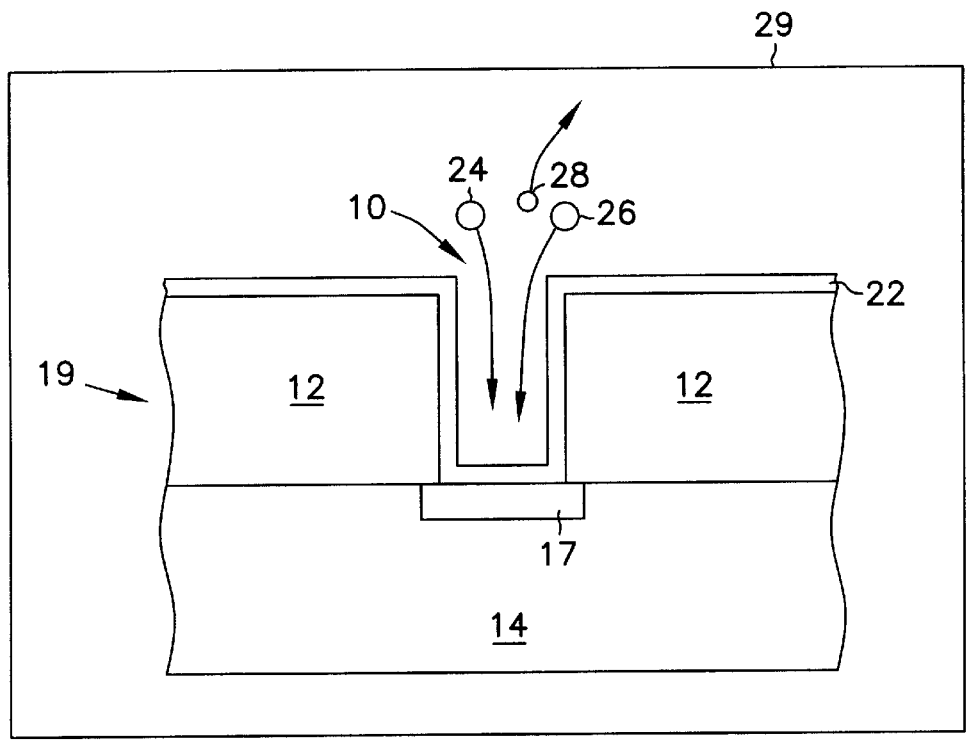
FIG. 2 is a cross-sectional view of the contact hole of FIG. 1A, comprising a film of second reducing agent.

In another embodiment, a cold wall-hot substrate reactor is used to form the conformal layer of titanium or titanium alloy. In one embodiment, a cold wall-hot substrate reactor is used for blanket depositions as this design is efficient in regard to precursor consumption. In one embodiment, first, a conformal film of a seed layer 22 comprising zinc is deposited on the insulator 12 and substrate 14, as shown in FIG. 2. The seed layer 22 is formed with CVD by combining a first reducing agent 24 with a first precursor 26, which are injected into the CVD reactor which is represented in block form at 29. In another embodiment, the seed layer 22 that is zinc may be formed by combining a first precursor 26 that is a dialkyl zinc or trimethyl zinc compound with a reducing agent 24 that is hydrogen.

When performing this step, the integrated circuit 19 is mounted on a substrate holder in the CVD reactor 29. The substrate 14 is heated to a temperature within a range of approximately 100 to 600 degrees Celsius and at a pressure approximately between 1 millitorr and 1 atmosphere. Alternatively, the temperature may range from approximately 300 to 550 degrees Celsius, or approximately 350 to 450 degrees Celsius. In one embodiment, the temperature is approximately 400° C. Also, alternatively, the pressure may range from approximately 10 millitorr to 100 torr. In one embodiment, the pressure is approximately 1 torr. A carrier gas of helium, argon or nitrogen may be used at a flow rate of between approximately 1 and 200 sccm. Alternatively, the flow rate may range between approximately 20 sccm and 1 liter. In one embodiment, the pressure is approximately 200 sccm. The first precursor 26 and the reducing agent 24 contact the heated silicon base layer and insulating layer 12, and form the seed layer 22 on the integrated circuit 19. This chemical process (I) is exemplified below:

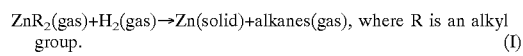

$ZnR_2(gas) + H_2(gas) \rightarrow Zn(solid) + alkanes(gas)$, where R is an alkyl group. (I)

First reaction products 28, such as gaseous alkanes, resulting from the formation of the seed layer 22 exit from the CVD reactor 29 through an exhaust manifold. The thickness of the seed layer 22 formed on the integrated circuit 19 is between approximately 5 and 50 angstroms. However, the present invention envisions forming a seed layer 22 that is thicker.

Figure 3A:
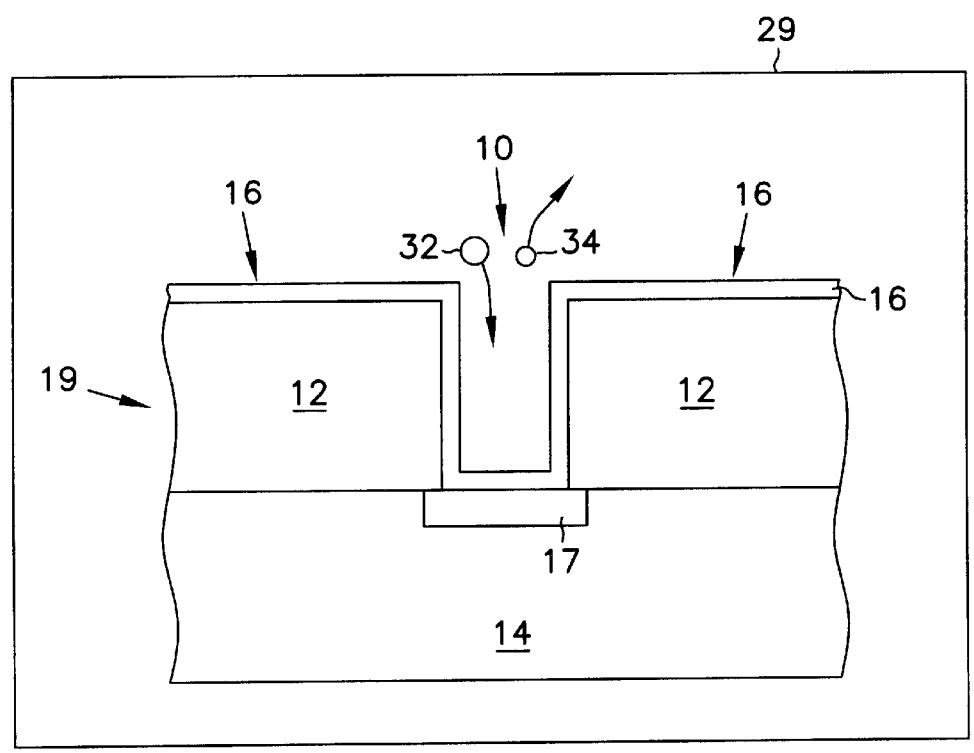
FIG. 3A is a cross-sectional view of the contact hole of FIG. 1A, comprising a titanium film.

Next, the seed layer 22 is converted to a layer 16 of titanium or a titanium alloy. As illustrated in FIG. 3A, a titanium precursor 32, such as titanium tetrachloride, is combined with the seed layer 22 by CVD to form a conformal layer 16 of titanium or titanium alloy in lieu of the seed layer 22.

When performing this step, the integrated circuit 19 is mounted and heated in the CVD reactor 29 to a temperature within a range of approximately 100 to 600 degrees Celsius and at a pressure approximately between 1 millitorr and 1 atmosphere. Alternatively, the temperature may range from approximately 100 to 700 degrees Celsius, approximately 300 to 550 degrees Celsius, or approximately 350 to 450 degrees Celsius. In one embodiment, the temperature is approximately 400° C. Also, alternatively, the pressure may range from approximately 10 millitorr to 100 torr. In one embodiment, the pressure is approximately 1 torr. A carrier gas of helium, argon or nitrogen may be used at a flow of between approximately 1 and 200 sccm. Alternatively, the flow rate may range between approximately 20 sccm and 1 liter. In one embodiment, the pressure is approximately 200 sccm. When the titanium precursor 32 contacts the seed layer 22 on the integrated circuit 19, the compounds form a conformal layer 16 of titanium or a titanium alloy. The chemical process (II) is exemplified below:

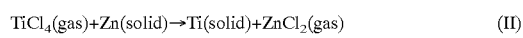

$TiCl_4(gas) + Zn(solid) \rightarrow Ti(solid) + ZnCl_2(gas)$ (II)

Second reaction products 34 resulting from the formation of the titanium or titanium alloy exit from the CVD reactor 29 through the exhaust manifold. Part or all of the seed layer 22 is respectively converted to a layer 16 of titanium or titanium alloy. Thus, for example, when the seed layer 22 is zinc, one atom of zinc on the integrated circuit 19 is replaced with one atom of titanium. Hence, the layer 16 of titanium, or titanium alloy, formed on the integrated circuit 19 will have about the same thickness as the originally deposited zinc. If this process step is conducted for a sufficient period of time, all of the seed layer 22 will be converted to a layer 16 of titanium. However, if not all of the seed layer 22 is converted to a layer 16 of titanium, a layer 16 of titanium alloy, including the seed layer 22, will be formed on the integrated circuit 19. These steps may be repeated to form thicker layers.

In another embodiment, the layer 16 of titanium or titanium alloy can be formed during a single CVD step, as exemplified by chemical process (III) below:

$$TiCl_4 + Zn(source) \rightarrow Ti + ZnCl_2 \qquad (III)$$

The zinc can be provided from one of many types of sources, including gaseous and solid sources. In one embodiment of such a single CVD step, the seed and titanium layers 22, 16 can be formed substantially simultaneously. The titanium or titanium alloy layer 16 can be formed by combining a first precursor 26, such as a dialkyl or trimethyl zinc compound, with a reducing agent 24, such as hydrogen, and a titanium precursor 32, such as titanium tetrachloride. When performing the CVD step, the integrated circuit 19 is mounted and heated in the CVD reactor 29 to a temperature within a range of approximately 100 to 600 degrees Celsius at a pressure of approximately between 1 millitorr and 1 atmosphere. Alternatively, the temperature may range from approximately 100 to 700 degrees Celsius, approximately 300 to 550 degrees Celsius, or approximately 350 to 450 degrees Celsius. In one embodiment, the temperature is approximately 400° C. Also, alternatively, the pressure may range from approximately 10 millitorr to 100 torr. In one embodiment, the pressure is approximately 1 torr. A carrier gas of helium, argon or nitrogen may be used at a flow rate of between approximately 1 and 200 sccm. Alternatively, the flow rate may range between approximately 20 sccm and 1 liter. In one embodiment, the pressure is approximately 200 sccm. When the first precursor 26 and the reducing agent 24 contact the heated silicon base layer and insulating layer 12, they form the seed layer 22 on the integrated circuit 19. Then, when the titanium precursor 32 contacts the seed layer 22, a conformal layer 16 of titanium or titanium alloy is formed on the integrated circuit. The resulting layer 16 of titanium or titanium alloy has a thickness between approximately 5 and 50 angstroms. However, the present invention envisions forming a thicker layer 16 titanium or titanium alloy. The chemical process (IV) is exemplified below:

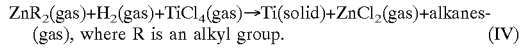

$$ZnR_2(gas) + H_2(gas) + TiCl_4(gas) \rightarrow Ti(solid) + ZnCl_2(gas) + alkanes\text{-}(gas), \text{ where R is an alkyl group.} \qquad (IV)$$

The reaction products 28, 34 exit from the CVD reactor 29 through the exhaust manifold.

Subsequently, the integrated circuit 19 is annealed at a temperature of between approximately 250 to 750 degrees Celsius. Alternatively, the temperature may range from approximately 250 to 800 degrees Celsius. In one embodiment, the temperature is approximately 700 degrees Celsius. As a result, the layer 16 of titanium or titanium alloy proximate to the silicon is converted to titanium silicide (TiSi, $TiSi_2$, $Ti_3Si_5$ or combinations thereof) to form the low resistance device contact 18. For via level applications, the anneal is not required. The via comprises a tungsten or aluminum fill on top of the layer 16 which is formed on top of a conductor (also represented by reference number 17) with an optional TiN layer therebetween.

In yet another embodiment, the low resistance device contact 18 of titanium silicide may be formed over the active region 17 when the layer 16 of titanium or titanium alloy is formed by CVD on the integrated circuit 19 at a temperature of between approximately 250 to 750 degrees Celsius. Alternatively, the temperature may range from approximately 250 to 800 degrees Celsius. In one embodiment, the temperature is approximately 700 degrees Celsius. Upon device contact 18 formation, additional metal layers, such as titanium nitride and tungsten, may be subsequently formed over the device contact 18 and layer 16 of titanium or titanium alloy.

Figure 3B:
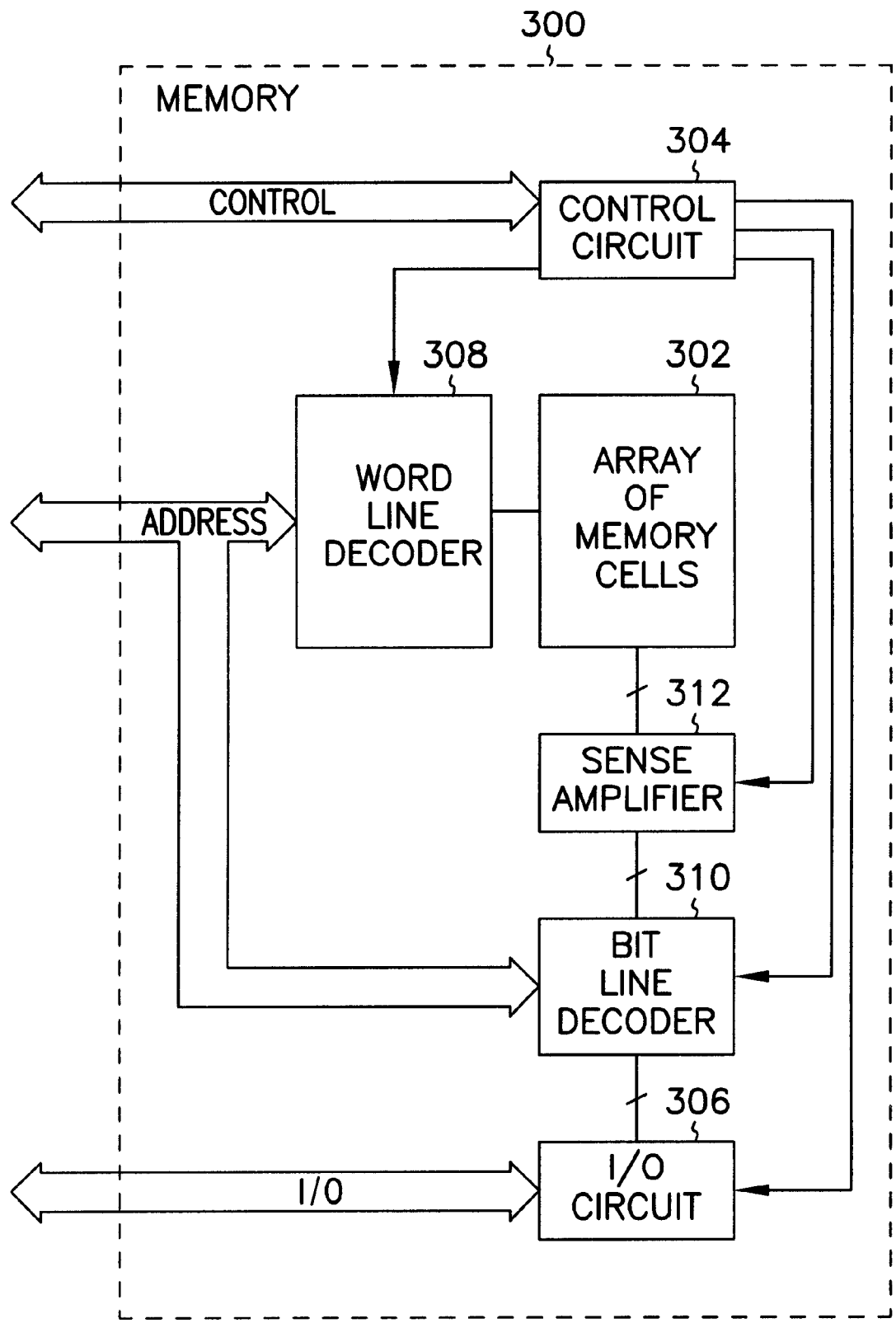
FIG. 3B is a block diagram of a memory.

In another embodiment, the integrated circuit 19 is a memory 300 in FIG. 3B, such as a dynamic random access memory. The memory 300 may include an array of memory cells 302, control circuit 304, I/O circuit, word line decoder 308, digit, or bit, line decoder 310, and sense amplifier 312 coupled in a manner known to one skilled in the art. Each of the aforementioned elements of the memory 300 includes contacts 18 and layers 16 of titanium, or titanium alloy, formed in the manner described above.

The present invention provides high step coverage, low resistivity titanium silicide device contacts to silicon, or titanium contacts to metal at the via level, formed at a relatively low temperature. It is to be understood that the above description is intended to be illustrative, and not restrictive. Many other embodiments will be apparent to those of skill in the art upon reviewing the above description. For example, other titanium precursors, such as tetradimethyl amino titanium (TDMAT) can be used to form layers 16 and device contacts 18. Additionally, the present invention may be implemented with any CVD apparatus 29, including hot wall reactors, cold wall reactors, radiation beam assisted reactors, plasma-assisted reactors, and the like. Furthermore, the seed layer 22 may be formed in any manner which provides a desired thickness film. Hence, the scope of the invention should, therefore, be determined with reference to the appended claims, along with the full scope of equivalents to which such claims are entitled.

What is claimed is:

1. An integrated circuit comprising:
   a layer of a titanium alloy; and
   a titanium silicide contact coupled to the layer, wherein the titanium alloy comprises titanium and zinc.

2. A memory, comprising:
   a memory array comprising a layer of a titanium alloy comprising titanium and zinc, and a titanium silicide contact coupled to the layer;
   a control circuit, operatively coupled to the memory array, the control circuit comprising a layer of a titanium alloy comprising titanium and zinc, and a titanium silicide contact coupled to the layer;
   an I/O circuit, operatively coupled to the memory array, the I/O circuit comprising a layer of a titanium alloy comprising titanium and zinc, and a titanium silicide contact coupled to the layer.

3. A contact, comprising:
   a titanium alloy layer formed overlying walls of a contact hole, wherein the titanium alloy layer comprises titanium and zinc; and
   a titanium silicide layer formed overlying an exposed silicon base layer of the contact hole.

4. A via, comprising:
   a titanium alloy layer formed overlying walls and an exposed base layer of a contact hole; and
   a fill coupled to the titanium alloy layer, wherein the fill comprises a metal selected from the group consisting of tungsten and aluminum, wherein the titanium alloy layer comprises titanium and zinc.

5. A via, comprising:
   a titanium zinc alloy layer formed overlying walls and an exposed base layer of a contact hole;
   a fill coupled to the titanium alloy layer, wherein the fill comprises a metal selected from the group consisting of tungsten and aluminum; and a titanium nitride layer interposed between the titanium alloy layer and the fill.

6. A via, comprising:

a titanium zinc alloy layer formed overlying walls and an exposed base layer of a contact hole;

a fill comprising a metal selected from the group consisting of tungsten and aluminum; and;

a titanium nitride layer interposed between the titanium zinc alloy layer and the fill.

7. A memory device, comprising:

a memory array;

a control circuit operatively coupled to the memory array; and an I/O circuit operatively coupled to the memory array;

wherein the memory device comprises at least one contact having a titanium zinc alloy layer formed overlying walls of a contact hole and a titanium silicide layer formed overlying an exposed silicon base layer of the contact hole.

8. A memory device, comprising:

a memory array;

a control circuit operatively coupled to the memory array; and an I/O circuit operatively coupled to the memory array;

wherein the memory device comprises a via having a titanium alloy layer formed overlying walls and an exposed base layer of a contact hole, and a fill coupled to the titanium alloy layer, and the fill comprises a metal selected from the group consisting of tungsten and aluminum, wherein the titanium alloy layer comprises titanium and zinc.

9. A memory device, comprising:

a memory array;

a control circuit operatively coupled to the memory array; and an I/O circuit operatively coupled to the memory array;

wherein the memory device comprises at least one via having a titanium zinc alloy layer formed overlying walls and an exposed base layer of a contact hole, a fill comprising a metal selected from the group consisting of tungsten and aluminum, and a titanium nitride layer interposed between the titanium zinc alloy layer and the fill.

10. A memory device, comprising:

a memory array;

a control circuit operatively coupled to the memory array; and an I/O circuit operatively coupled to the memory array;

wherein the memory device comprises at least one via having a titanium zinc alloy layer formed overlying walls and an exposed base layer of a contact hole, a fill comprising a metal selected from the group consisting of tungsten and aluminum, and a titanium nitride layer interposed between the titanium alloy layer and the fill.

11. The memory device of claim 7 wherein the memory array comprises a contact having a titanium zinc alloy layer formed overlying walls of a contact hole and a titanium silicide layer formed overlying an exposed silicon base layer of the contact hole.

12. The memory device of claim 7 wherein the control circuit comprises a contact having a titanium zinc alloy layer formed overlying walls of a contact hole and a titanium silicide layer formed overlying an exposed silicon base layer of the contact hole.

13. The memory device of claim 7 wherein the I/O circuit comprises a contact having a titanium zinc alloy layer formed overlying walls of a contact hole and a titanium silicide layer formed overlying an exposed silicon base layer of the contact hole.

14. The memory device of claim 8 wherein the memory array comprises a via having a titanium alloy layer formed overlying walls and an exposed base layer of a contact hole, and a fill coupled to the titanium alloy layer, wherein the titanium alloy layer comprises titanium and zinc, and the fill comprises a metal selected from the group consisting of tungsten and aluminum.

15. The memory device of claim 8 wherein the control circuit comprises a via having a titanium alloy layer formed overlying walls and an exposed base layer of a contact hole, and a fill coupled to the titanium alloy layer, wherein the titanium alloy layer comprises titanium and zinc, and the fill comprises a metal selected from the group consisting of tungsten and aluminum.

16. The memory device of claim 8 wherein the I/O circuit comprises a via having a titanium alloy layer formed overlying walls and an exposed base layer of a contact hole, and a fill coupled to the titanium alloy layer, wherein the titanium alloy layer comprises titanium and zinc, and the fill comprises a metal selected from the group consisting of tungsten and aluminum.

17. The memory device of claim 9 wherein the memory array comprises a via having a titanium alloy layer formed overlying walls and an exposed base layer of a contact hole, a fill comprising a metal selected from the group consisting of tungsten and aluminum, and a titanium nitride layer interposed between the titanium alloy layer and the fill.

18. The memory device of claim 9 wherein the control circuit comprises a via having a titanium alloy layer formed overlying walls and an exposed base layer of a contact hole, a fill comprising a metal selected from the group consisting of tungsten and aluminum, and a titanium nitride layer interposed between the titanium alloy layer and the fill.

19. The memory device of claim 9 wherein the I/O circuit comprises a via having a titanium alloy layer formed overlying walls and an exposed base layer of a contact hole, a fill comprising a metal selected from the group consisting of tungsten and aluminum, and a titanium nitride layer interposed between the titanium alloy layer and the fill.

20. The memory device of claim 10 wherein the memory array comprises a via having a titanium zinc alloy layer formed overlying walls and an exposed base layer of a contact hole, a fill comprising a metal selected from the group consisting of tungsten and aluminum, and a titanium nitride layer interposed between the titanium alloy layer and the fill.

21. The memory device of claim 10 wherein the control circuit comprises a via having a titanium zinc alloy layer formed overlying walls and an exposed base layer of a contact hole, a fill comprising a metal selected from the group consisting of tungsten and aluminum, and a titanium nitride layer interposed between the titanium alloy layer and the fill.

22. The memory device of claim 10 wherein the I/O circuit comprises a via having a titanium zinc alloy layer formed overlying walls and an exposed base layer of a contact hole, a fill comprising a metal selected from the group consisting of tungsten and aluminum, and a titanium nitride layer interposed between the titanium alloy layer and the fill.

* * * * *

UNITED STATES PATENT AND TRADEMARK OFFICE
CERTIFICATE OF CORRECTION

PATENT NO.    : 6,433,434 B1
DATED         : August 13, 2002
INVENTOR(S)   : Gurtej Singh Sandhu and Donald L. Westmoreland It is certified that error appears in the above-identified patent and that said Letters Patent is hereby corrected as shown below:

Title page,
Item [56], U.S. PATENT DOCUMENTS,
Delete "436/60" and insert -- 437/60 --, therefor.
Delete "5,834,131" and insert -- 5,834,371 --, therefor.
OTHER PUBLICATIONS,
Delete "TiSi2" and insert -- $TiSi_2$ --, therefor.
Delete "4020" and insert -- 402 --, therefor.
Delete "TiSi2" and insert -- $TiSi_2$ --, therefor.
Delete "H2" and insert -- $H_2$ --, therefor.
Delete "TiCL4" and insert -- $TiCl_4$ --, therefor.
Insert -- , -- after "89".
Delete "TiSi2" and insert -- $TiSi_2$ --, therefor.
Delete "." (next to US) and insert -- , --, therefor.
Delete "Tech" and insert -- Tech., --, therefor.

Column 1,
Line 34, delete "siuicide" and insert -- silicide --, therefor.

Signed and Sealed this

First Day of April, 2003

JAMES E. ROGAN
*Director of the United States Patent and Trademark Office*